(12) United States Patent
Li et al.

(10) Patent No.: US 12,046,609 B2
(45) Date of Patent: Jul. 23, 2024

(54) SOLID-STATE IMAGE SENSOR

(71) Applicant: VisEra Technologies Company Limited, Hsin-Chu (TW)

(72) Inventors: Ching-Hua Li, Taoyuan (TW); Cheng-Hsuan Lin, Taipei (TW); Zong-Ru Tu, Zhubei (TW); Yu-Chi Chang, Hsinchu County (TW); Han-Lin Wu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 379 days.

(21) Appl. No.: 17/496,472

(22) Filed: Oct. 7, 2021

(65) Prior Publication Data
US 2023/0110102 A1   Apr. 13, 2023

(51) Int. Cl.
*H01L 27/146* (2006.01)
*H04N 25/704* (2023.01)

(52) U.S. Cl.
CPC .. *H01L 27/14621* (2013.01); *H01L 27/14627* (2013.01); *H01L 27/14645* (2013.01); *H04N 25/704* (2023.01)

(58) Field of Classification Search
CPC ......... H01L 27/14621; H01L 27/14627; H01L 27/14645; H01L 27/14625; H01L 27/14665; H04N 25/704
See application file for complete search history.

(56) References Cited

U.S. PATENT DOCUMENTS

| | | | | |
|---|---|---|---|---|
| 10,453,890 | B2* | 10/2019 | Kaneda | H04N 25/704 |
| 10,686,000 | B1* | 6/2020 | Lin | H01L 27/14621 |
| 2016/0211294 | A1* | 7/2016 | Lin | H01L 27/1464 |
| 2017/0084652 | A1* | 3/2017 | Chang | H01L 27/14627 |
| 2018/0076247 | A1 | 3/2018 | Pang et al. | |
| 2019/0052823 | A1 | 2/2019 | Jung et al. | |

(Continued)

FOREIGN PATENT DOCUMENTS

| | | |
|---|---|---|
| JP | 2015-213144 A | 11/2015 |
| JP | 2016-225584 A | 12/2016 |

(Continued)

OTHER PUBLICATIONS

Office Action of its corresponding KR application No. 10-2021-0194096 issued on May 12, 2023 with its English translation; pp. 1-10.

(Continued)

*Primary Examiner* — Mamadou L Diallo
(74) *Attorney, Agent, or Firm* — Muncy, Geissler, Olds & Lowe, P.C.

(57) ABSTRACT

A solid-state image sensor is provided. The solid-state image sensor includes photoelectric conversion elements and a color filter layer disposed above the photoelectric conversion elements. The photoelectric conversion elements and the color filter layer form normal pixels and auto-focus pixels, the color filter layer that correspond to the normal pixels are divided into first color filter segments and second color filter segments, the first color filter segments are disposed on at least one side that is closer to an incident light, and the width of the first color filter segments is greater than the width of the second color filter segments.

20 Claims, 12 Drawing Sheets

(56) References Cited

U.S. PATENT DOCUMENTS

| | | | |
|---|---|---|---|
| 2020/0098813 A1 | 3/2020 | Huang et al. | |
| 2020/0161352 A1* | 5/2020 | Takahashi | H04N 25/704 |
| 2020/0280659 A1 | 9/2020 | Galor Gluskin | |
| 2020/0396388 A1* | 12/2020 | Kim | H04N 25/75 |
| 2021/0358985 A1* | 11/2021 | Lin | H01L 27/14645 |
| 2022/0149097 A1* | 5/2022 | Li | H01L 27/1463 |
| 2022/0181372 A1* | 6/2022 | Lee | H01L 27/14621 |
| 2022/0384507 A1* | 12/2022 | Park | H01L 27/14636 |

FOREIGN PATENT DOCUMENTS

| | | |
|---|---|---|
| JP | 2017-063171 A | 3/2017 |
| JP | 2021-145121 A | 9/2021 |
| KR | 10-2021-0054092 | 5/2021 |
| KR | 10-2021-0114837 | 9/2021 |
| WO | WO2021/106670 | 6/2021 |

OTHER PUBLICATIONS

Office Action of its corresponding JP application No. 2022-043531 issued on May 23, 2023 with its English translation; pp. 1-10.

\* cited by examiner

SOLID-STATE IMAGE SENSOR

BACKGROUND

Technical Field

The embodiments of the present disclosure relate to image sensors, and in particular they relate to solid-state image sensors that include color filter segments having variable widths.

Description of the Related Art

Solid-state image sensors (e.g., complementary metal-oxide semiconductor (CMOS) image sensors) have been widely used in various image-capturing apparatuses such as digital still-image cameras, digital video cameras, and the like. Signal electric charges may be generated according to the amount of light received in the light-sensing portion (e.g., photoelectric conversion element) of the solid-state image sensor. In addition, the signal electric charges generated in the light-sensing portion may be transmitted and amplified, whereby an image signal is obtained.

Recently, the trend has been for the pixel size of image sensors typified by CMOS image sensors to be reduced for the purpose of increasing the number of pixels to provide high-resolution images. When an oblique incident light (e.g., chief ray angle (CRA) is not equal to 0) directly radiates into the solid-state image sensor that includes different normal pixels (e.g., different color filter segments) and phase-detection auto-focus (PDAF) pixels, different sensitivities of the pixels may occur according to different positions, resulting in channel separation. This channel separation will cause problems with image detection.

BRIEF SUMMARY

According to some embodiments of the present disclosure, the solid-state image sensor includes color filter segments having variable widths, which may improve channel separation, thereby improving the quality of the image signal from the photoelectric conversion elements of the solid-state image sensors.

In accordance with some embodiments of the present disclosure, a solid-state image sensor is provided. The solid-state image sensor includes photoelectric conversion elements and a color filter layer disposed above the photoelectric conversion elements. The photoelectric conversion elements and the color filter layer form normal pixels and auto-focus pixels, the color filter layer that correspond to the normal pixels are divided into first color filter segments and second color filter segments, the first color filter segments are disposed on at least one side that is closer to an incident light, and the width of the first color filter segments is greater than the width of the second color filter segments.

In some embodiments, at least one of the first color filter segments that is adjacent to the auto-focus pixels has a greater width than other first color filter segments.

In some embodiments, the color filter layer has four color regions corresponding to at least two different colors, and at least one of the auto-focus pixels is disposed in and corresponds to one of the four color regions.

In some embodiments, the width of the first color filter segments in one of the four color regions is different from the width of the first color filter segments in another of the four color regions.

In some embodiments, each color region corresponds to an $n^2$ pixel array, where n is an integer greater than or equal to 3.

In some embodiments, the auto-focus pixels form an auto-focus pixel array, and the auto-focus pixel array is a p×q pixel array, where p and q are integers less than n.

In some embodiments, the four color regions form a unit pattern, and more than one unit pattern form an array.

In some embodiments, the auto-focus pixels are disposed in and correspond to all of the four color regions.

In some embodiments, the auto-focus pixels are disposed in and correspond to at least two of the four color regions.

In some embodiments, the normal pixels have a constant pixel width that is equal to or less than 0.7 µm.

In some embodiments, the solid-state image sensor further includes a grid structure disposed between the first color filter segments and between the second color filter segments. The grid structure has grid segments, and each grid segment has a variable width.

In some embodiments, the solid-state image sensor further includes a metal grid disposed on the bottom of the grid structure. The metal grid has metal segments, and the metal segments have a constant width.

In some embodiments, each metal segment has a variable width with respect to the corresponding grid segment.

In some embodiments, the solid-state image sensor further includes condensing structures disposed on and corresponding to the first color filter segments and the second color filter segments.

In some embodiments, each condensing structure has a variable width with respect to the corresponding one of the first color filter segments and the second color filter segments.

In some embodiments, at least one of the first color filter segments and the second color filter segments has a shift with respect to the corresponding photoelectric conversion elements.

In some embodiments, the auto-focus pixels form two or more auto-focus pixel arrays.

In some embodiments, the auto-focus pixel arrays are disposed in and correspond to at least two of the four color regions.

In some embodiments, the auto-focus pixel arrays are disposed in and correspond to all of the four color regions.

In some embodiments, the normal pixels include red color filters, green color filters, blue color filters, yellow color filters, white color filters, cyan color filters, magenta color filters, or IR/NIR color filters.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
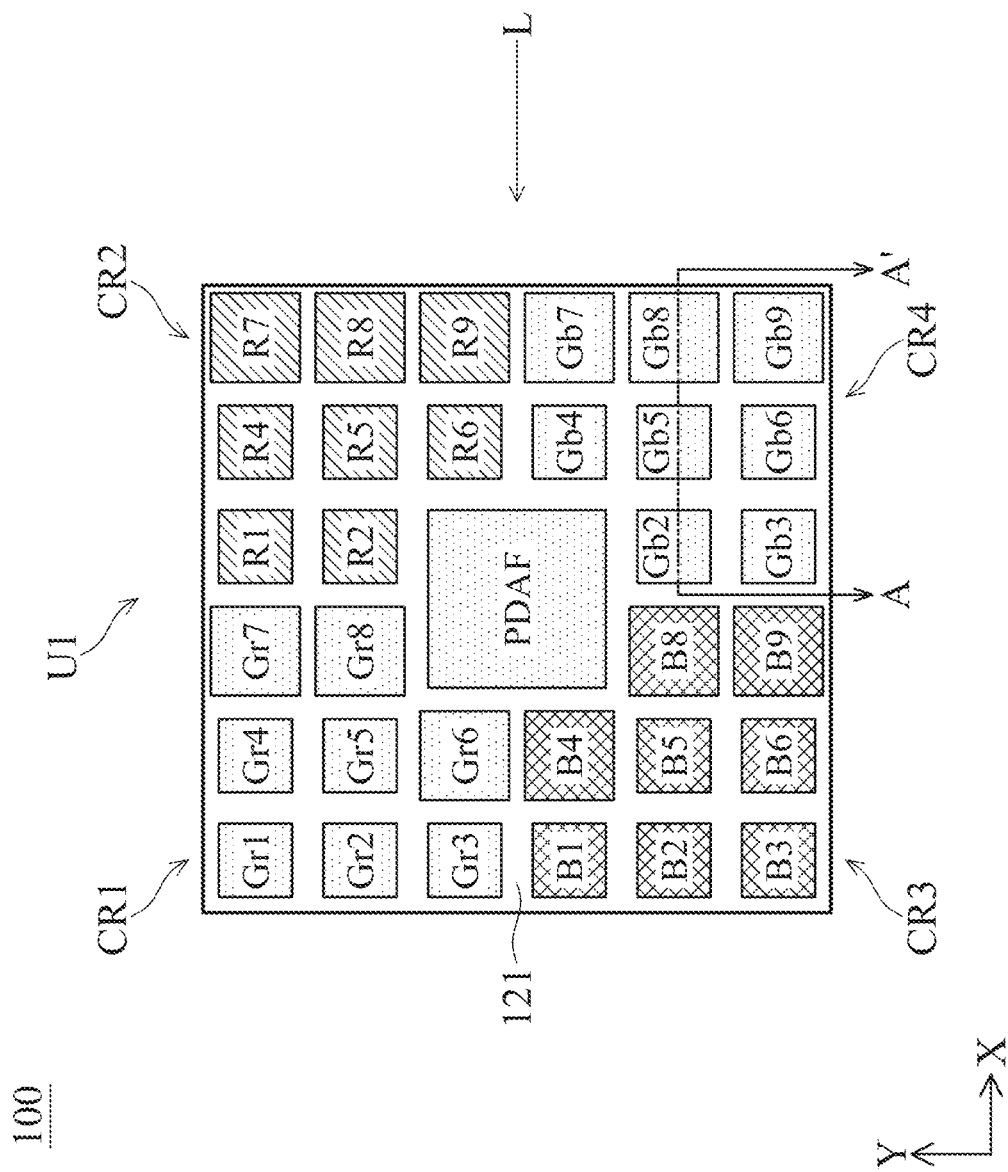
FIG. 1 is a partial top view illustrating the solid-state image sensor in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Solid-state image sensors may be roughly classified into two groups in terms of the direction of light incident on a light receiving unit. One is the front-side illuminated (FSI) image sensors that receive light incident on the front side of a semiconductor substrate on which the wiring layer of the reading circuit is formed. Another is the back-side illuminated (BSI) image sensors that receive light incident on the back side of a semiconductor substrate on which no wiring layer is formed. For imaging a color image, color filter layers may be provided in the FSI and BSI image sensors.

Figure 2:
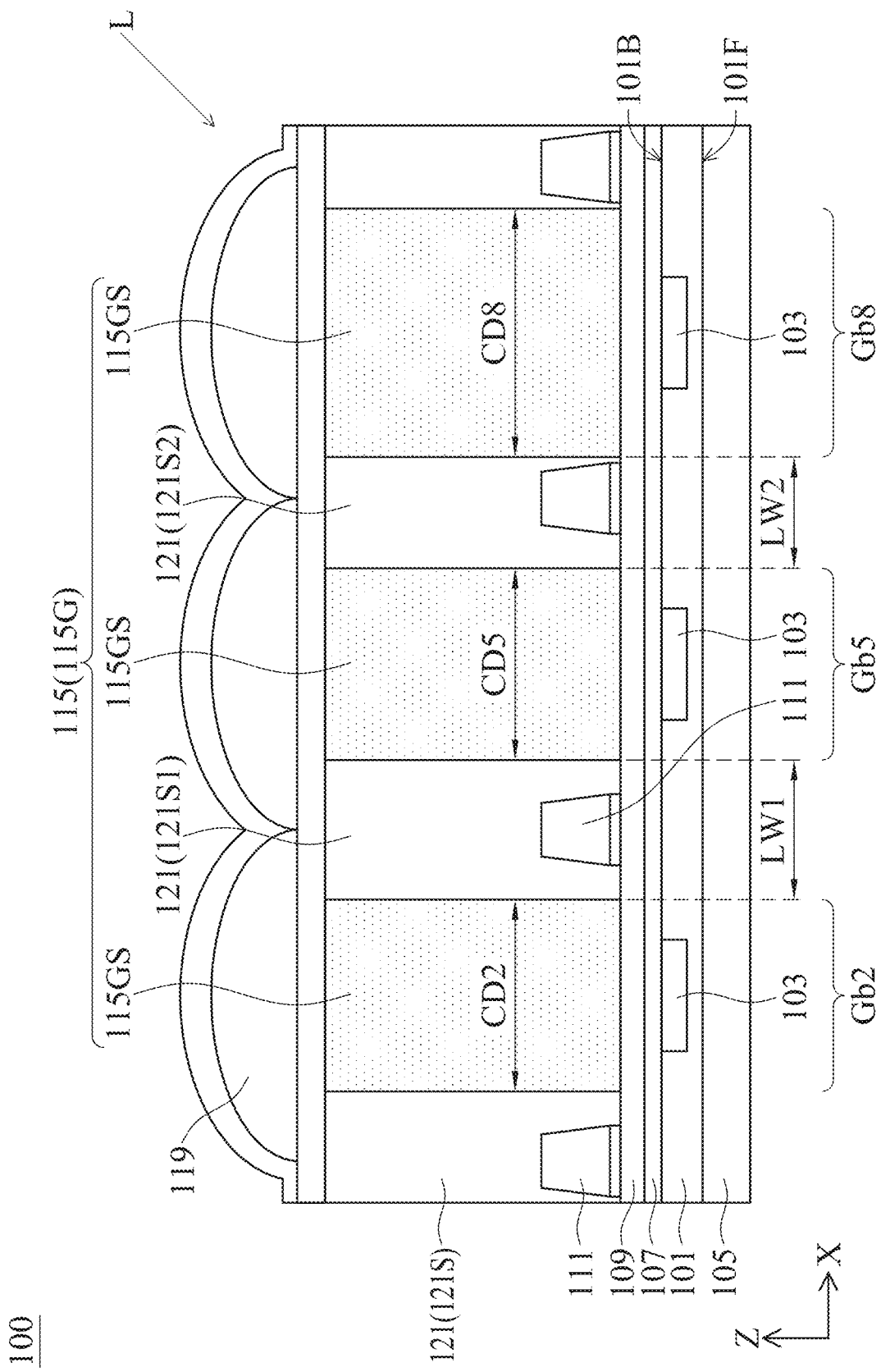
FIG. 2 is a partial cross-sectional view illustrating the solid-state image sensor along line A-A' in FIG. 1.

FIG. 1 is a partial top view illustrating the solid-state image sensor 100 in accordance with some embodiments of the present disclosure. FIG. 2 is a partial cross-sectional view illustrating the solid-state image sensor 100 along line A-A' in FIG. 1. In more detail, FIG. 1 shows the pixel arrangement of the solid-state image sensor 100, and FIG. 2 shows a portion of the cross-sectional view of the solid-state image sensor 100. It should be noted that some components of the solid-state image sensor 100 have been omitted in FIG. 1 and FIG. 2 for sake of brevity.

Referring to FIG. 1, in some embodiments, the solid-state image sensor 100 includes normal pixels (e.g., Gr1, Gr2, Gr3, Gr4, Gr5, Gr6, Gr7, Gr8, R1, R2, R4, R5, R6, R7, R8, R9, B1, B2, B3, B4, B5, B6, B8, B9, Gb2, Gb3, Gb4, Gb5, Gb6, Gb7, Gb8, and Gb9) and auto-focus pixels, and the auto-focus pixels form an auto-focus pixel array PDAF. In some embodiments, the normal pixels have a constant pixel width that is equal to or less than 0.7 µm.

Referring to FIG. 2, in some embodiments, the solid-state image sensor 100 includes a semiconductor substrate 101 which may be, for example, a wafer or a chip. The semiconductor substrate 101 has a front surface 101F and a back surface 101B opposite to the front surface 101F. In some embodiments, multiple photoelectric conversion elements 103 (e.g., photodiodes) are formed in the semiconductor substrate 101. For example, the photoelectric conversion elements 103 in the semiconductor substrate 101 may be isolated from each other by isolation structures (not shown) such as shallow trench isolation (STI) regions or deep trench isolation (DTI) regions. The isolation structures may be formed in the semiconductor substrate 101 using etching process to form trenches and filling the trenches with an insulating or dielectric material.

As shown in FIG. 2, the photoelectric conversion elements 103 may be formed on the back surface 101B of the semiconductor substrate 101, and a wiring layer 105 may be formed on the front surface 101F of the semiconductor substrate 101, but the present disclosure is not limited thereto. The wiring layer 105 may be an interconnect structure that includes multiple conductive lines and vias embedded in multiple dielectric layers, and may further include various electric circuits required for the solid-state image sensor 100. Incident lights may radiate onto the side of the back surface 101B and be received by the photoelectric conversion elements 103.

In the embodiment shown in FIG. 2, the solid-state image sensor 100 is referred to as a back-side illuminated (BSI) image sensor. In some other examples, the solid-state image sensor may be a front-side illuminated (FSI) image sensor. The semiconductor substrate 101 and the wiring layer 105 shown in FIG. 2 may be inverted for FSI image sensor. In the FSI image sensor, incident lights radiate onto the side of the front surface 101F, pass through the wiring layer 105 and then are received by the photoelectric conversion elements 103 formed on the back surface 101B of the semiconductor substrate 101.

As shown in FIG. 2, the solid-state image sensor 100 may also include a high dielectric-constant (high-κ) film 107 formed on the back surface 101B of the semiconductor substrate 101 and covering the photoelectric conversion elements 103. The high-κ film 107 may include hafnium oxide ($HfO_2$), hafnium tantalum oxide (HMO), hafnium titanium oxide (HMO), hafnium zirconium oxide (HfZrO), tantalum pentoxide ($Ta_2O_5$), any other suitable high-κ dielectric material, or a combination thereof, but the present disclosure is not limited thereto. The high-κ film 107 may be formed by a deposition process. The deposition process is, for example, chemical vapor deposition (CVD), plasma enhanced chemical vapor deposition (PECVD), atomic layer deposition (ALD), or another deposition technique. The high-κ film 107 may have a high-refractive index and a light-absorbing ability.

As shown in FIG. 2, the solid-state image sensor 100 may further include a buffer layer 109 formed on the high-κ film 107. The buffer layer 109 may include silicon oxides, silicon nitrides, silicon oxynitrides, any other suitable insulating material, or a combination thereof, but the present disclosure is not limited thereto. The buffer layer 109 may be formed by a deposition process. The deposition process is, for example, spin-on coating, chemical vapor deposition, flowable chemical vapor deposition (FCVD), plasma enhanced chemical vapor deposition, physical vapor deposition (PVD), or another deposition technique.

As shown in FIG. 2, in some embodiments, the solid-state image sensor 100 includes a color filter layer 115 disposed above the photoelectric conversion elements 103, and the color filter layer 115 has (or is divided into) color filter segments. For example, the green color filter layer 115G is disposed above the photoelectric conversion elements 103, and the green color filter layer 115G has (or is divided into) green color filter segments 115GS as shown in FIG. 2.

Referring to FIG. 1 and FIG. 2, in some embodiments, the photoelectric conversion elements 103 and the color filter layer 115 (or color filter segments) form the normal pixels (e.g., Gr1, Gr2, Gr3, Gr4, Gr5, Gr6, Gr7, Gr8, R1, R2, R4, R5, R6, R7, R8, R9, B1, B2, B3, B4, B5, B6, B8, B9, Gb2, Gb3, Gb4, Gb5, Gb6, Gb7, Gb8, and Gb9) and the auto-focus pixels, the color filter layer 115 that correspond to the normal pixels are divided into first color filter segments (e.g., Gb8 in FIG. 1 and FIG. 2) and second color filter segments (e.g., Gb2/Gb5 in FIG. 1 and FIG. 2), the first color filter segments are disposed on at least one side that is closer to the incident light L, the second color filter segments are disposed on other positions, and the width of the first color filter segments is greater than the width of the second color filter segments.

As shown in FIG. 1, in some embodiments, the color filter layer 115 has four color regions CR1, CR2, CR3, and CR4, and at least one of the auto-focus pixels is disposed in and corresponds to one of the four color regions CR1, CR2, CR3, and CR4. In some embodiments, each of the color regions CR1, CR2, CR3, and CR4 corresponds to an $n^2$ pixel array, where n is an integer greater than or equal to 3. In some embodiments, the auto-focus pixel array PDAF is a p×q pixel array, where p and q are integers less than n. For example, each of the color regions CR1, CR2, CR3, and CR4 corresponds to a 3×3 pixel array as shown in FIG. 1, but the present disclosure is not limited thereto.

As shown in FIG. 1, in some embodiments, the four color regions CR1, CR2, CR3, and CR4 form a unit pattern U1. Further, the normal pixels Gr1, Gr2, Gr3, Gr4, Gr5, Gr6, Gr7, Gr8 are in the color region CR1, the normal pixels R1, R2, R4, R5, R6, R7, R8, R9 are in the color region CR2, the normal pixels B1, B2, B3, B4, B5, B6, B8, B9 are in the color region CR3, and the normal pixels Gb2, Gb3, Gb4, Gb5, Gb6, Gb7, Gb8, Gb9 are in the color region CR4. Furthermore, the auto-focus pixel array PDAF is in the center of the unit pattern U1. For example, the auto-focus pixel array PDAF is a 2×2 pixel array disposed in the center of the unit pattern U1 as shown in FIG. 1, but the present disclosure is not limited thereto.

In some embodiments, the color regions CR1, CR2, CR3, and CR4 correspond to at least two different colors. For example, as shown in FIG. 1, the color region CR1 may correspond to the color green, the color region CR2 may correspond to the color red, the color region CR3 may correspond to the color blue, and the color region CR4 may correspond to the color green, but the present disclosure is not limited thereto.

That is, in some embodiments, the normal pixels include red color filters, so that the normal pixels R1, R2, R4, R5, R6, R7, R8, R9 receive red light; the normal pixels also include green color filters, so that the normal pixels Gr1, Gr2, Gr3, Gr4, Gr5, Gr6, Gr7, Gr8, Gb2, Gb3, Gb4, Gb5, Gb6, Gb7, Gb8, Gb9 receive green light; the normal pixels further include blue color filters, so that the normal pixels B1, B2, B3, B4, B5, B6, B8, B9 receive blue light. In some other embodiments, the normal pixels include yellow color filters, white color filters, cyan color filters, magenta color filters, IR/NIR color filters, or a combination thereof.

As shown in FIG. 1 and FIG. 2, the incident light L is from the right side of the unit pattern U1 of the solid-state image sensor 100, and in the color region CR4, the color filter layer 115 (the green color filter segment 115GS) that corresponds to the normal pixel Gb8 is disposed on the side that is closer to the incident light L, so that the color filter layer 115 (the green color filter segment 115GS) that corresponds to the normal pixel Gb8 may be referred to as the first color filter segment, and the color filter layer 115 (the green color filter segment 115GS) that corresponds to the normal pixel Gb5 or the normal pixel Gb2 may be referred to as the second color filter segment. In this embodiments, the width CD8 of the green color filter segment 115GS that corresponds to the normal pixel Gb8 is greater than the width CD5 (or CD2) of the green color filter segment 115GS that corresponds to the normal pixel Gb5 (or Gb2).

Moreover, the width of the green color filter segment 115GS that corresponds to the normal pixel Gb7 or Gb9 (which may also be referred to as the first color filter segment) is greater than the width of the green color filter segment 115GS that corresponds to the normal pixel Gb3, Gb4, or Gb6 (which may also be referred to as the second color second segment).

Similarly, as shown in FIG. 1, the width of the green color filter segment 115GS that corresponds to the normal pixel Gr6, Gr7, or Gr8 (which may be referred to as the first color filter segment) is greater than the width of the green color filter segment 115GS that corresponds to the normal pixel Gr1, Gr2, Gr3, Gr4, or Gr5 (which may be referred to as the second color filter segment).

In some embodiments, at least one first color filter segment that is adjacent to the auto-focus pixel array PDAF has a greater width than other first color filter segments. For example, as shown in FIG. 1, the normal pixel Gr6 or Gr8 is adjacent to the auto-focus pixel array PDAF, so that the green color filter segment 115GS that corresponds to the normal pixel Gr6 or Gr8 may have a greater width than the green color filter segment 115GS that corresponds to the normal pixel Gr7, but the present disclosure is not limited thereto. In some other embodiments, the green color filter segments 115GS that correspond to the normal pixel Gr6, Gr7, and Gr8 may have the same width.

In some embodiments, the width of the first color filter segment in one color region is different from the width of the first color filter segment in another color region. For example, the width of the green color filter segment 115GS that corresponds to the normal pixel Gr6, Gr7, or Gr8 (which may be referred to as the first color filter segment) in the color region CR1 may be different from the width CD8 of the green color filter segment 115GS that corresponds to the normal pixel Gb8 in the color region CR4, but the present disclosure is not limited thereto.

As shown in FIG. 1 and FIG. 2, in some embodiments, the solid-state image sensor 100 includes a grid structure 121 disposed between the color filter segments (e.g., the green color filter segments 115GS in FIG. 2). As shown in FIG. 2, in some embodiments, the grid structure 121 has (or is divided into) grid segments 121S (or 121S1 or 121S2). For example, the grid structure 121 may include a transparent dielectric material that has a low refractive index in a range from about 1.0 to about 1.99. Moreover, in the embodiments of the present disclosure, the refractive index of the grid structure 121 is lower than the refractive index of the color filter layer 115 (e.g., the green color filter layer 115G in FIG. 2).

In some embodiments, each grid segment has a variable width. For example, as shown in FIG. 2, the width LW1 of the grid segment 121S1 is greater than the width LW2 of the grid segment 121S2, but the present disclosure is not limited thereto. The width of the grid segment may be adjusted according to the adjacent (surrounding) color filter segment (e.g., the green color filter segments 115GS in FIG. 2).

As shown in FIG. 2, in some embodiments, the solid-state image sensor 100 includes a metal grid 111 disposed on the bottom of the grid structure 121. For example, the metal structure 111 may include tungsten (W), aluminum (Al), metal nitride (e.g., titanium nitride (TiN)), any other applicable material, or a combination thereof, but the present disclosure is not limited thereto. As shown in FIG. 2, in the cross-sectional view of the solid-state image sensor 100, the metal grid 111 has (or is divided into) metal segments. In the embodiments shown in FIG. 2, the metal segments have a constant width.

As shown in FIG. 2, in some embodiments, the solid-state image sensor 100 includes condensing structures 119 disposed on and corresponding to the color filter segments (e.g., the green color filter segments 115GS in FIG. 2) for condensing incident light. For example, the condensing structures 119 may include glass, epoxy resin, silicone resin, polyurethane, any other applicable material, or a combination thereof, but the present disclosure is not limited thereto.

In some embodiments, the condensing structure 119 is a micro-lens structure, such as a semi-convex lens or a convex lens. In some other embodiments, the condensing structure 119 is a micro-pyramid structure (e.g., circular cone, quadrangular pyramid, and so on), or a micro-trapezoidal structure (e.g., flat top cone, truncated square pyramid, and so on). Alternatively, in some embodiments, the condensing structure 119 is a gradient-index structure.

As shown in FIG. 2, each condensing structure 119 corresponds to one green color filter segment 115GS, but the present disclosure is not limited thereto. In some other embodiments, each condensing structure 119 corresponds to at least two color filter segments.

Figure 3:
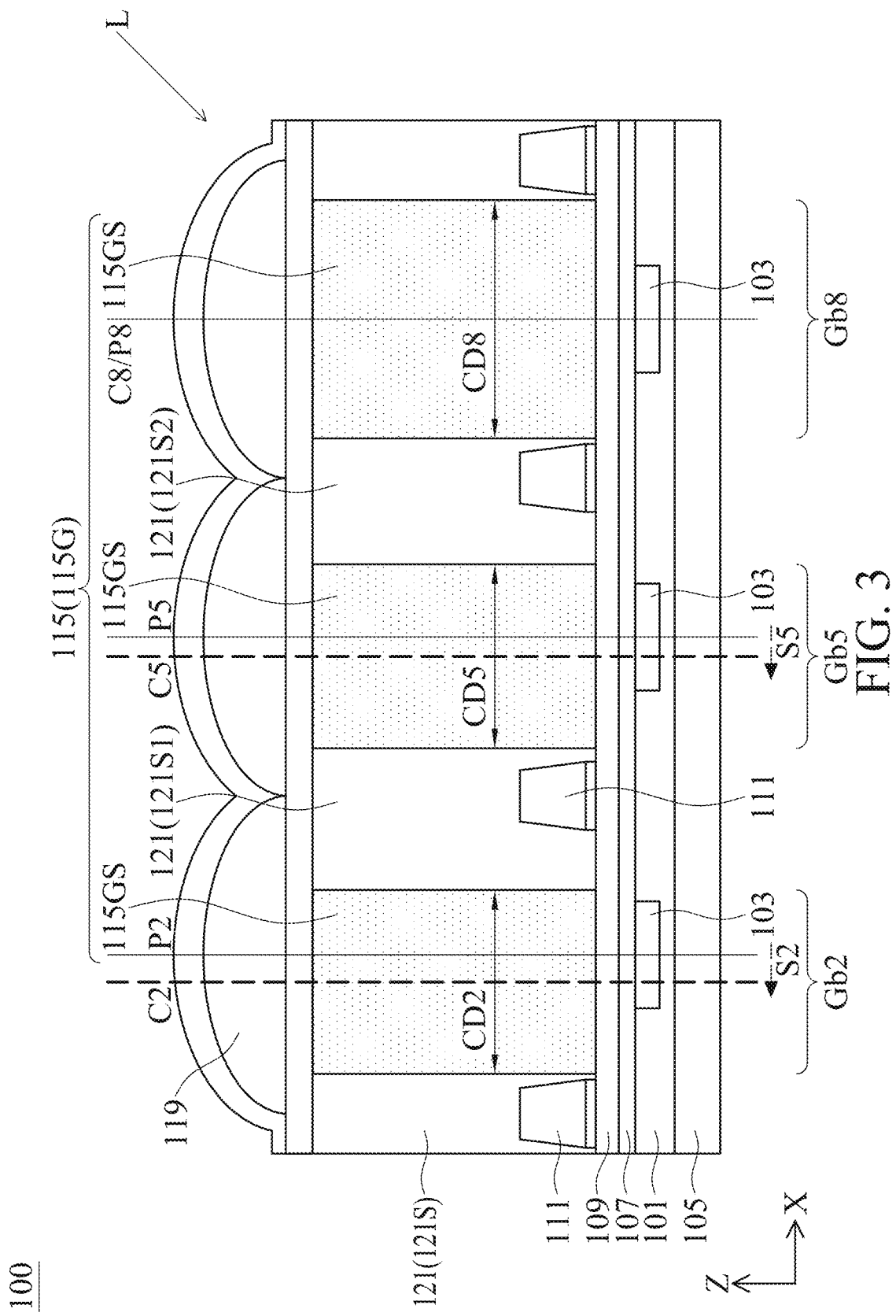
FIG. 3 is a partial cross-sectional view illustrating the solid-state image sensor in accordance with some other embodiments of the present disclosure.

FIG. 3 is a partial cross-sectional view illustrating the solid-state image sensor 100 in accordance with some other embodiments of the present disclosure. For example, FIG. 3 may also be a partial cross-sectional view illustrating the solid-state image sensor 100 along line A-A' in FIG. 1.

In some embodiments, at least one color filter segment (the first color filter segment and/or the second color filter segment) has a shift with respect to the corresponding photoelectric conversion element 103. For example, as shown in FIG. 1 and FIG. 3, the green color filter segment 115GS that corresponds to the normal pixel Gb5 has a shift S5 with respect to the corresponding photoelectric conversion element 103. That is, the distance between the central axis C5 of the green color filter segment 115GS that corresponds to the normal pixel Gb5 and the central axis P5 of the corresponding photoelectric conversion element 103 is the shift S5. Moreover, as shown in FIG. 1 and FIG. 3, the green color filter segment 115GS that corresponds to the normal pixel Gb2 has a shift S2 with respect to the corresponding photoelectric conversion element 103. That is, the distance between the central axis C2 of the green color filter segment 115GS that corresponds to the normal pixel Gb2 and the central axis P2 of the corresponding photoelectric conversion element 103 is the shift S2. In this example, the shift S2 may be greater than the shift S5, but the present disclosure is not limited thereto.

Furthermore, as shown in FIG. 1 and FIG. 3, the green color filter segment 115GS that corresponds to the normal pixel Gb8 has no shift with respect to the corresponding photoelectric conversion element 103. That is, the central axis C8 of the green color filter segment 115GS that corresponds to the normal pixel Gb8 may overlap the central axis P8 of the corresponding photoelectric conversion element 103.

Figure 4:
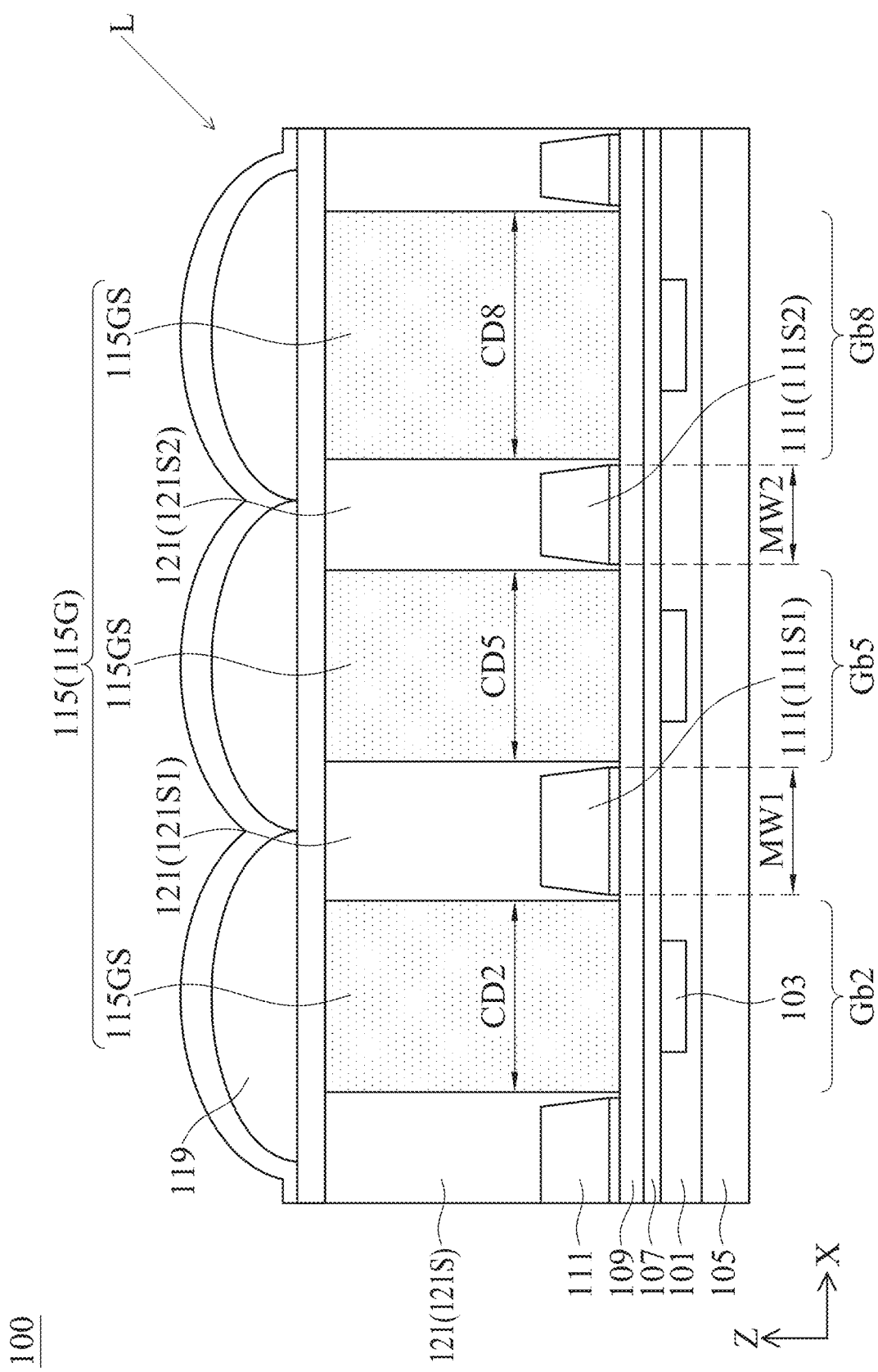
FIG. 4 is a partial cross-sectional view illustrating the solid-state image sensor in accordance with some other embodiments of the present disclosure.

FIG. 4 is a partial cross-sectional view illustrating the solid-state image sensor 100 in accordance with some other embodiments of the present disclosure. For example, FIG. 4 may also be a partial cross-sectional view illustrating the solid-state image sensor 100 along line A-A' in FIG. 1.

In some embodiments, the metal segment has a variable width with respect to the corresponding the grid segment 121S. For example, as shown in FIG. 4, the width MW1 of the metal segment 111S1 (that is disposed on the bottom of the grid segment 121S1) may be greater than the width MW2 of the metal segment 111S2 (that is disposed on the bottom of the grid segment 121S2), but the present disclosure is not limited thereto. The width of the metal segment may be adjusted according to the corresponding grid segment 121S.

Figure 5:
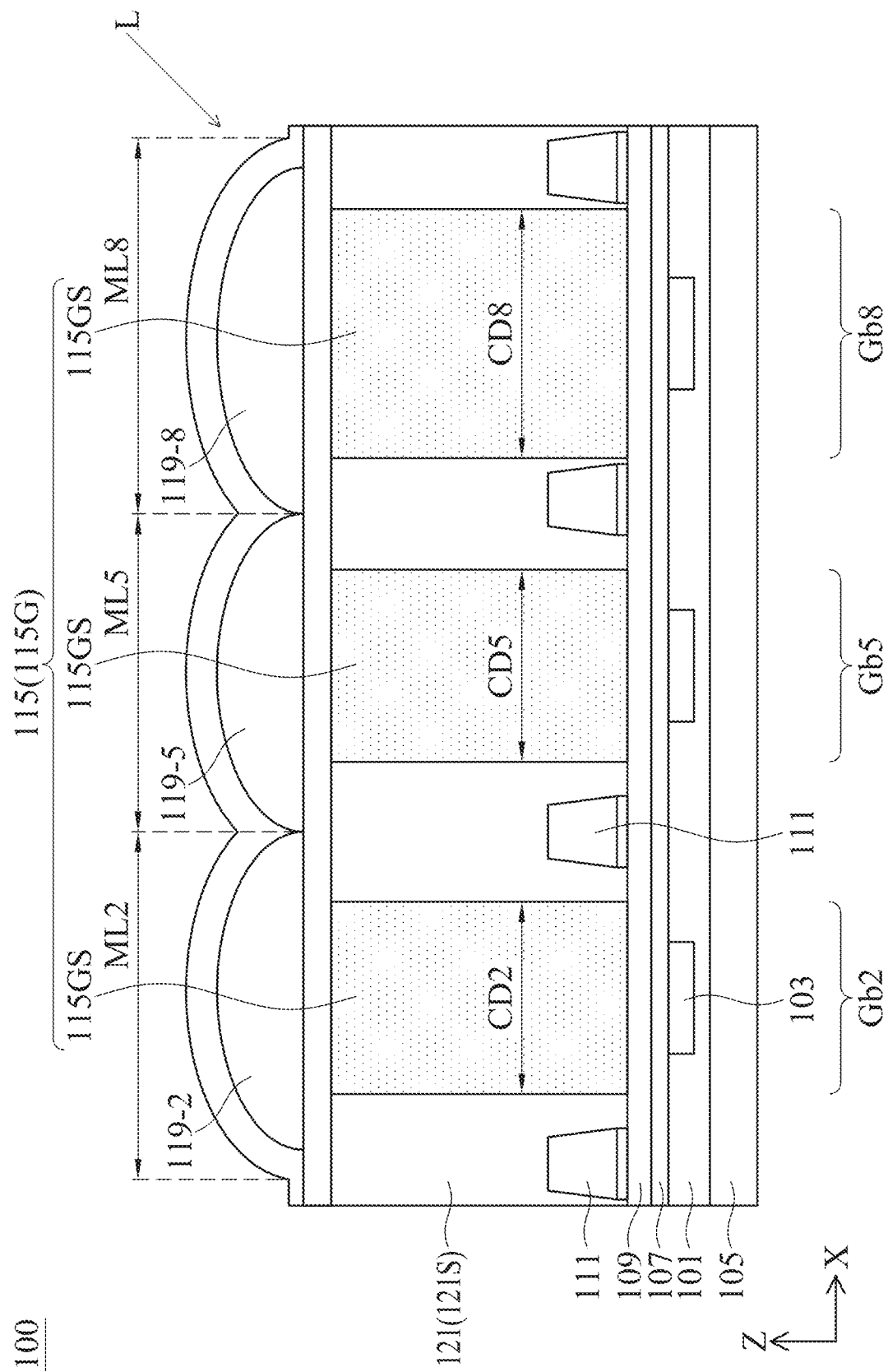
FIG. 5 is a partial cross-sectional view illustrating the solid-state image sensor in accordance with some other embodiments of the present disclosure.

FIG. 5 is a partial cross-sectional view illustrating the solid-state image sensor 100 in accordance with some other embodiments of the present disclosure. For example, FIG. 5 may also be a partial cross-sectional view illustrating the solid-state image sensor 100 along line A-A' in FIG. 1.

In some embodiments, the condensing structure 119 has a variable width with respect to the corresponding color filter segment (e.g., the green color filter segment 115GS in FIG. 5). For example, as shown in FIG. 5, the width ML8 of the condensing structure 119-8 may be greater than the width ML2 of the condensing structure 119-2 and the width ML5 of the condensing structure 119-5, but the present disclosure is not limited thereto. The width of the condensing structure 119 may be adjusted according to the corresponding color filter segment (e.g., the green color filter segment 115GS in FIG. 5).

Figure 6:
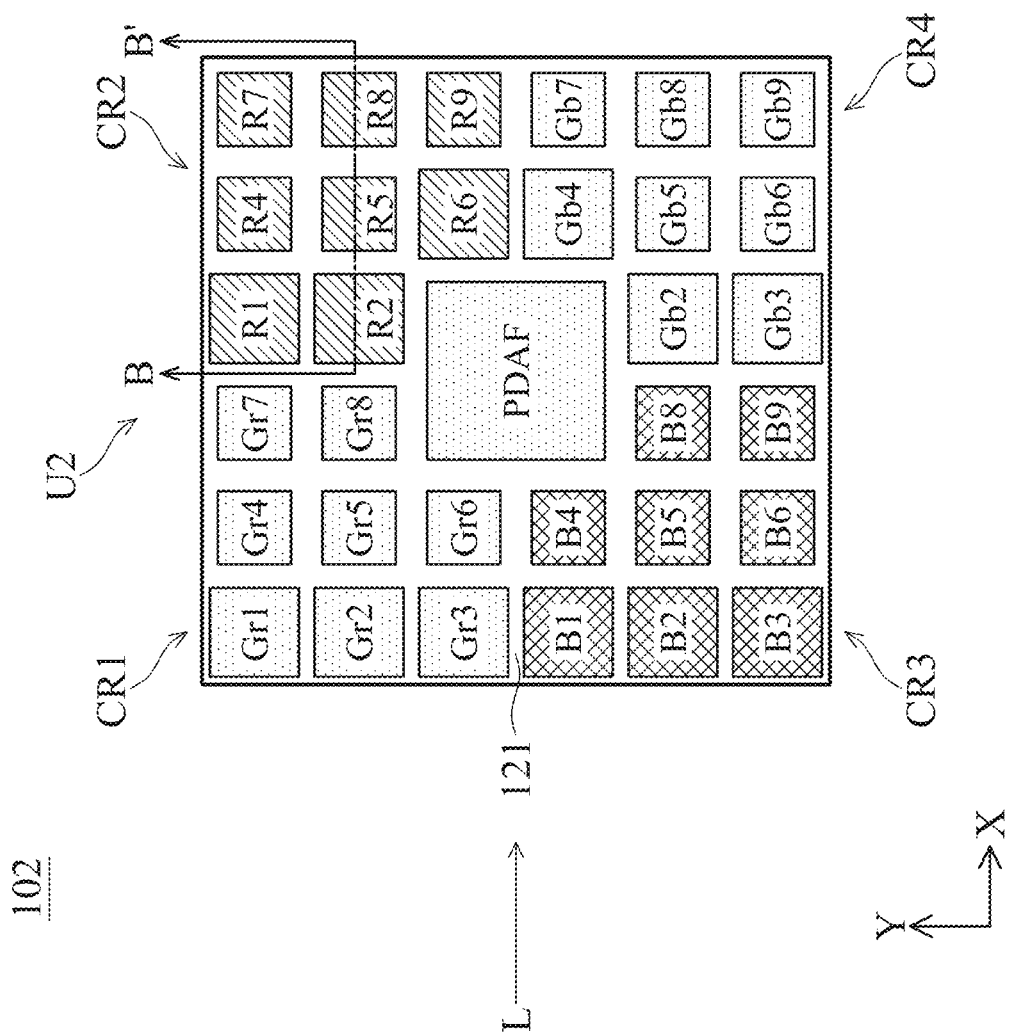
FIG. 6 is a partial top view illustrating the solid-state image sensor in accordance with some embodiments of the present disclosure.
Figure 7:
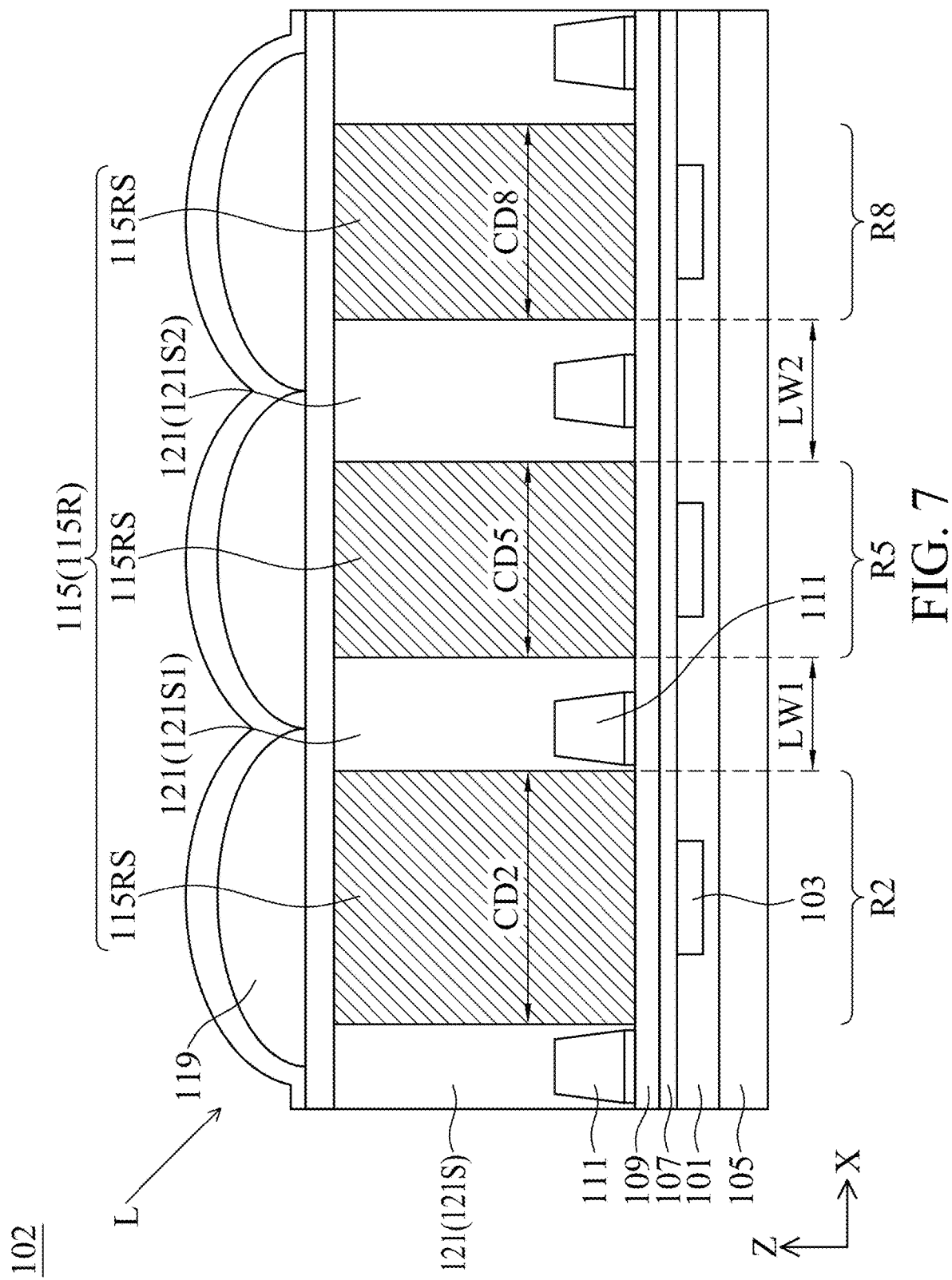
FIG. 7 is a partial cross-sectional view illustrating the solid-state image sensor along line B-B' in FIG. 6.

FIG. 6 is a partial top view illustrating the solid-state image sensor 102 in accordance with some embodiments of the present disclosure. FIG. 7 is a partial cross-sectional view illustrating the solid-state image sensor 102 along line B-B' in FIG. 6. In more detail, FIG. 6 shows the pixel arrangement of the solid-state image sensor 102, and FIG. 7 shows a portion of the cross-sectional view of the solid-state image sensor 102. It should be noted that some components of the solid-state image sensor 102 have been omitted in FIG. 6 and FIG. 7 for sake of brevity.

Similarly, the color filter layer 115 has four color regions CR1, CR2, CR3, and CR4, and at least one of the auto-focus pixels is disposed in and corresponds to one of the four color regions CR1, CR2, CR3, and CR4. As shown in FIG. 6, in some embodiments, the four color regions CR1, CR2, CR3, and CR4 form a unit pattern U2. As shown in FIG. 7, the red color filter layer 115R is disposed above the photoelectric conversion elements 103, and the red color filter layer 115R has (or is divided into) red color filter segments 115RS.

As shown in FIG. 6 and FIG. 7, the incident light L is from the left side of the unit pattern U2 of the solid-state image sensor 102, and in the color region CR2, the color filter layer 115 (the red color filter segment 115RS) that corresponds to the normal pixel R2 is disposed on the side that is closer to the incident light L, so that the color filter layer 115 (the red color filter segment 115RS) that corresponds to the normal pixel R2 may be referred to as the first color filter segment, and the color filter layer 115 (the red color filter segment 115RS) that corresponds to the normal pixel R5 or the normal pixel R8 may be referred to as the second color filter segment. As shown in FIG. 7, in this embodiments, the width CD2 of the red color filter segment 115RS that corresponds to the normal pixel R2 is greater than the width CD5 (or CD8) of the red color filter segment 115RS that corresponds to the normal pixel R5 (or R8).

Figure 8:
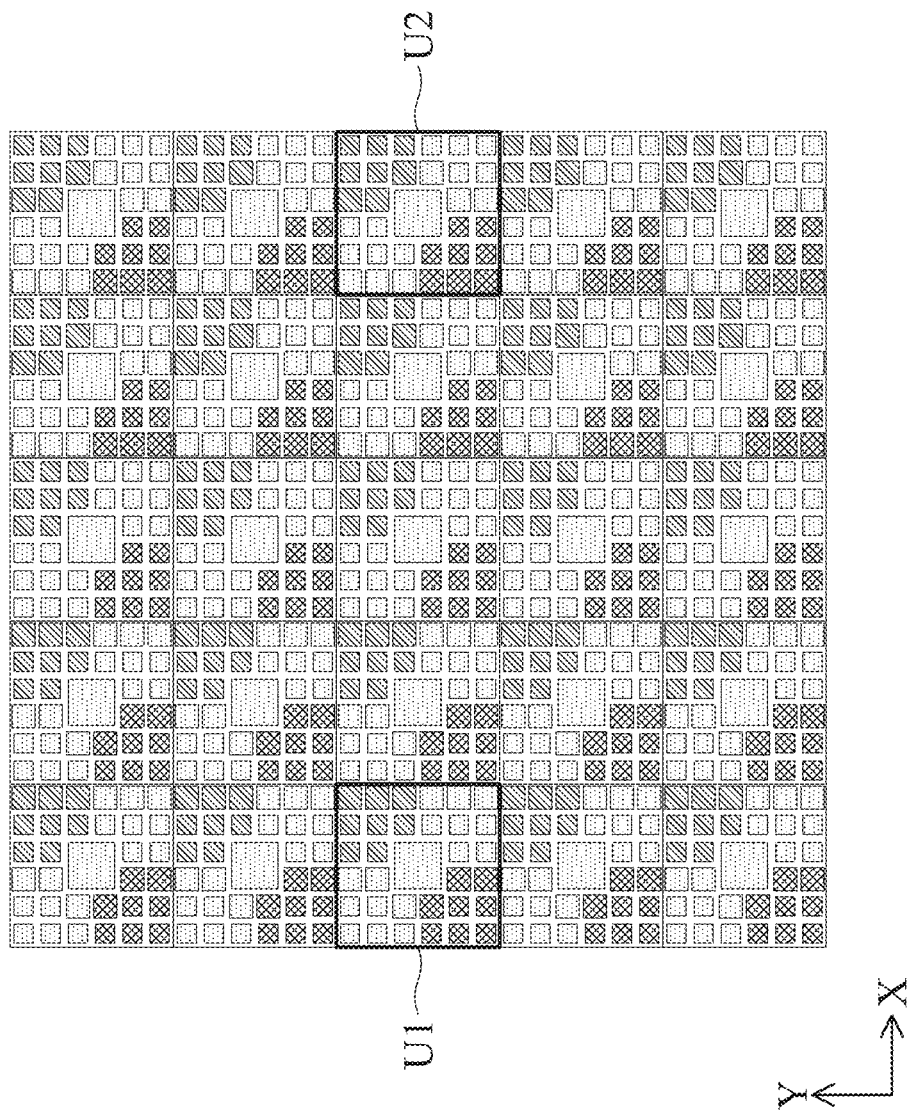
FIG. 8 is a partial top view illustrating the solid-state image sensor in accordance with some other embodiments of the present disclosure.

FIG. 8 is a partial top view illustrating the solid-state image sensor 104 in accordance with some other embodiments of the present disclosure. Referring to FIG. 8, in some embodiments, more than one unit pattern forms an array. That is, there is more than one unit pattern in the solid-state image sensor 104. For example, as shown in FIG. 8, the color filter layer (or the color regions) of the solid-state image sensor 104 may form twenty-five (5×5) unit patterns, among which include the unit pattern U1 as shown in FIG. 1 (in the left side of the solid-state image sensor 104) and the unit pattern U2 as shown in FIG. 6 (in the right side the solid-state image sensor 104), but the present disclosure is not limited thereto. The number and pixel arrangement of unit patterns may be adjusted depending on actual need.

Figure 9:
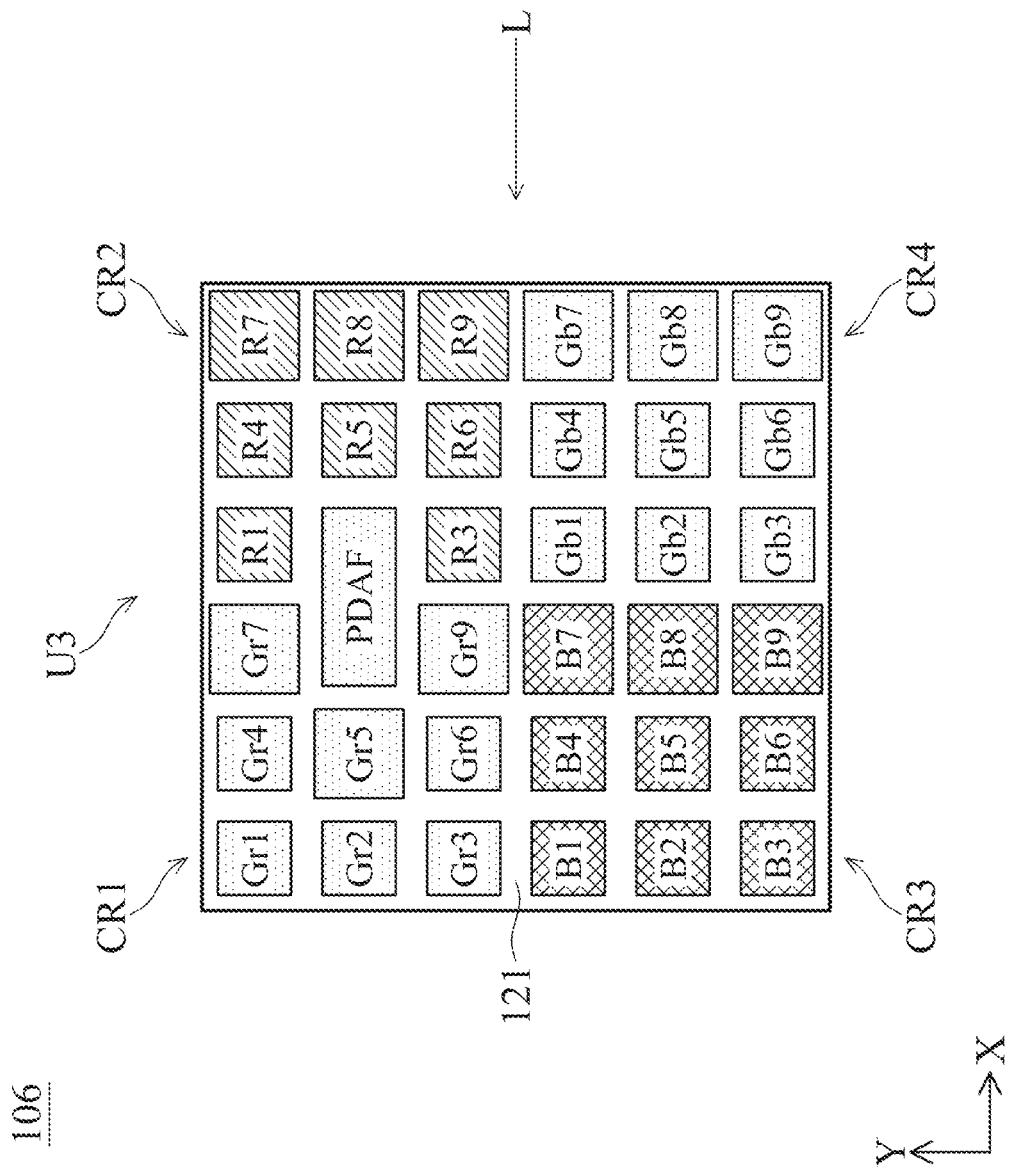
FIG. 9 is a partial top view illustrating the solid-state image sensor in accordance with some embodiments of the present disclosure.

FIG. 9 is a partial top view illustrating the solid-state image sensor 106 in accordance with some embodiments of the present disclosure. As shown in FIG. 9, in some embodiments, four color regions CR1, CR2, CR3, and CR4 of the solid-state image sensor 106 form a unit pattern U3. For example, each of the color regions CR1, CR2, CR3, and CR4 corresponds to a 3×3 pixel array. Moreover, the auto-focus pixel array PDAF is a 2×1 pixel array, and is not disposed in the center of the unit pattern U3.

As shown in FIG. 9, the incident light L is from the right side of the unit pattern U3 of the solid-state image sensor 106. In the color region CR1, the color filter layer (or the (green) color filter segment) that corresponds to the normal pixel Gr5, Gr7, or Gr9 is disposed on the side that is closer to the incident light L, so that the width of the (green) color filter segment that corresponds to the normal pixel Gr5, Gr7, or Gr9 is greater than the width of the (green) color filter segment that corresponds to the normal pixel Gr1, Gr2, Gr3, Gr4, or Gr6. In the color region CR2, the color filter layer (or the (red) color filter segment) that corresponds to the normal pixel R7, R8, or R9 is disposed on the side that is closer to the incident light L, so that the width of the (red) color filter segment that corresponds to the normal pixel R7, R8, or R9 is greater than the width of the (red) color filter segment that corresponds to the normal pixel R1, R3, R4, R5, or R6. In the color region CR3, the color filter layer (or the (blue) color filter segment) that corresponds to the normal pixel B7, B8, or B9 is disposed on the side that is closer to the incident light L, so that the width of the (blue) color filter segment that corresponds to the normal pixel B7, B8, or B9 is greater than the width of the (blue) color filter segment that corresponds to the normal pixel B1, B2, B3, B4, B5, or B6. In the color region CR4, the color filter layer (or the (green) color filter segment) that corresponds to the normal pixel Gb7, Gb8, or Gb9 is disposed on the side that is closer to the incident light L, so that the width of the (green) color filter segment that corresponds to the normal pixel Gb7, Gb8, or Gb9 is greater than the width of the (green) color filter segment that corresponds to the normal pixel Gb1, Gb2, Gb3, Gb4, Gb5, or Gb6.

Figure 10:
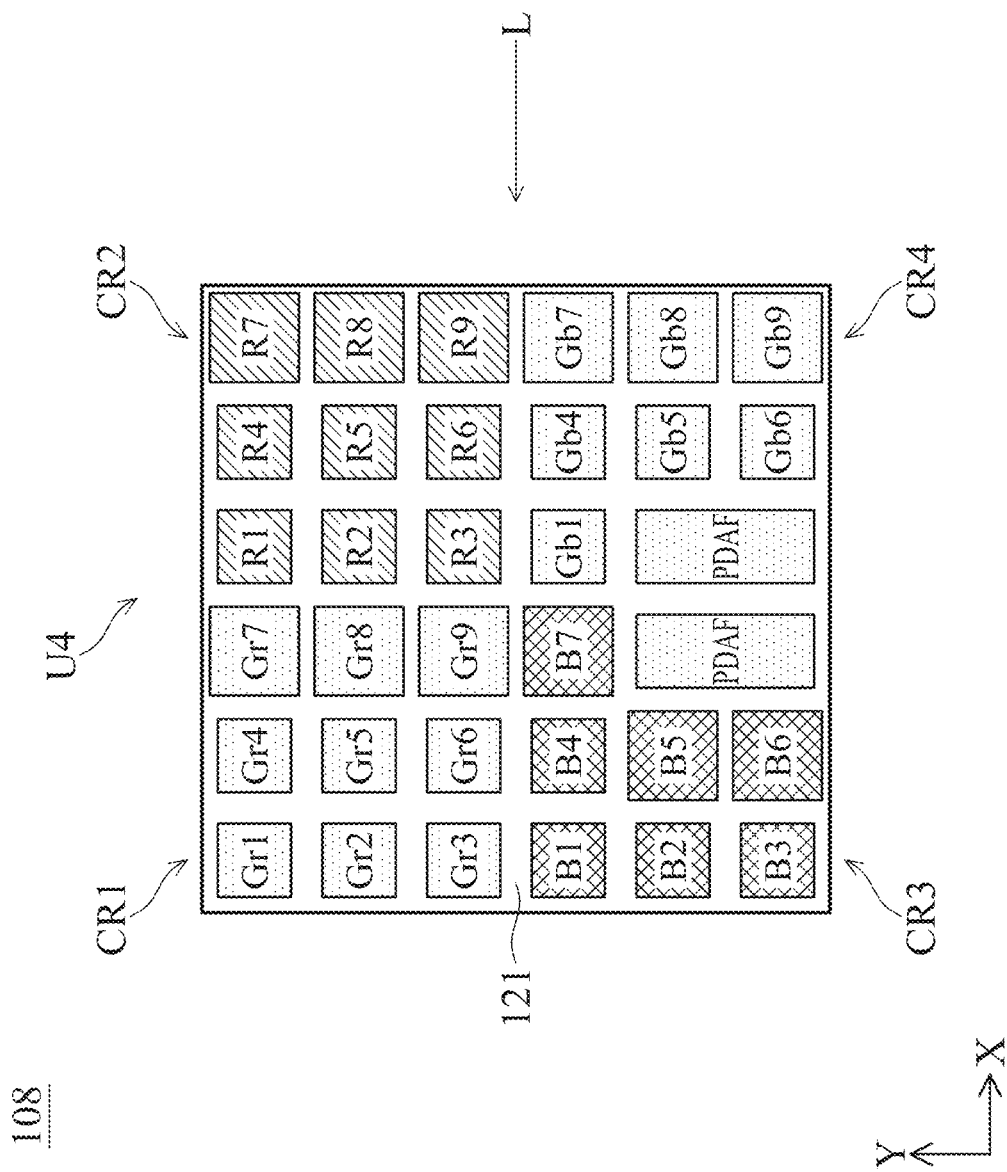
FIG. 10 is a partial top view illustrating the solid-state image sensor in accordance with some embodiments of the present disclosure.

FIG. 10 is a partial top view illustrating the solid-state image sensor 108 in accordance with some embodiments of the present disclosure. As shown in FIG. 10, in some embodiments, four color regions CR1, CR2, CR3, and CR4 of the solid-state image sensor 108 form a unit pattern U4. For example, each of the color regions CR1, CR2, CR3, and CR4 corresponds to a 3×3 pixel array. In some embodiments, the auto-focus pixels form two or more auto-focus pixel arrays PDAF. That is, there is more than one auto-focus pixel array PDAF in the unit pattern U4. For example, two auto-focus pixel arrays PDAF are in the unit pattern U4. In more detail, two auto-focus pixel arrays PDAF are disposed in and correspond to the color regions CR3 and CR4. Moreover, each auto-focus pixel array PDAF is a 1×2 pixel array, and is disposed near the lower side of the unit pattern U4.

As shown in FIG. 10, the incident light L is from the right side of the unit pattern U4 of the solid-state image sensor 108. In the color region CR1, the color filter layer (the (green) color filter segment) that corresponds to the normal pixel Gr7, Gr8, or Gr9 is disposed on the side that is closer to the incident light L, so that the width of the (green) color filter segment that corresponds to the normal pixel Gr7, Gr8, or Gr9 is greater than the width of the (green) color filter segment that corresponds to the normal pixel Gr1, Gr2, Gr3, Gr4, Gr5, or Gr6. In the color region CR2, the color filter layer (the (red) color filter segment) that corresponds to the normal pixel R7, R8, or R9 is disposed on the side that is closer to the incident light L, so that the width of the (red) color filter segment that corresponds to the normal pixel R7, R8, or R9 is greater than the width of the (red) color filter segment that corresponds to the normal pixel R1, R2, R3, R4, R5, or R6. In the color region CR3, the color filter layer (the (blue) color filter segment) that corresponds to the normal pixel B5, B6, or B7 is disposed on the side that is closer to the incident light L, so that the width of the (blue) color filter segment that corresponds to the normal pixel B5, B6, or B7 is greater than the width of the (blue) color filter segment that corresponds to the normal pixel B1, B2, B3, or B4. In the color region CR4, the color filter layer (the (green) color filter segment) that corresponds to the normal pixel Gb7, Gb8, or Gb9 is disposed on the side that is closer to the incident light L, so that the width of the (green) color filter segment that corresponds to the normal pixel Gb7, Gb8, or Gb9 is greater than the width of the (green) color filter segment that corresponds to the normal pixel Gb1, Gb4, Gb5, or Gb6.

Figure 11:
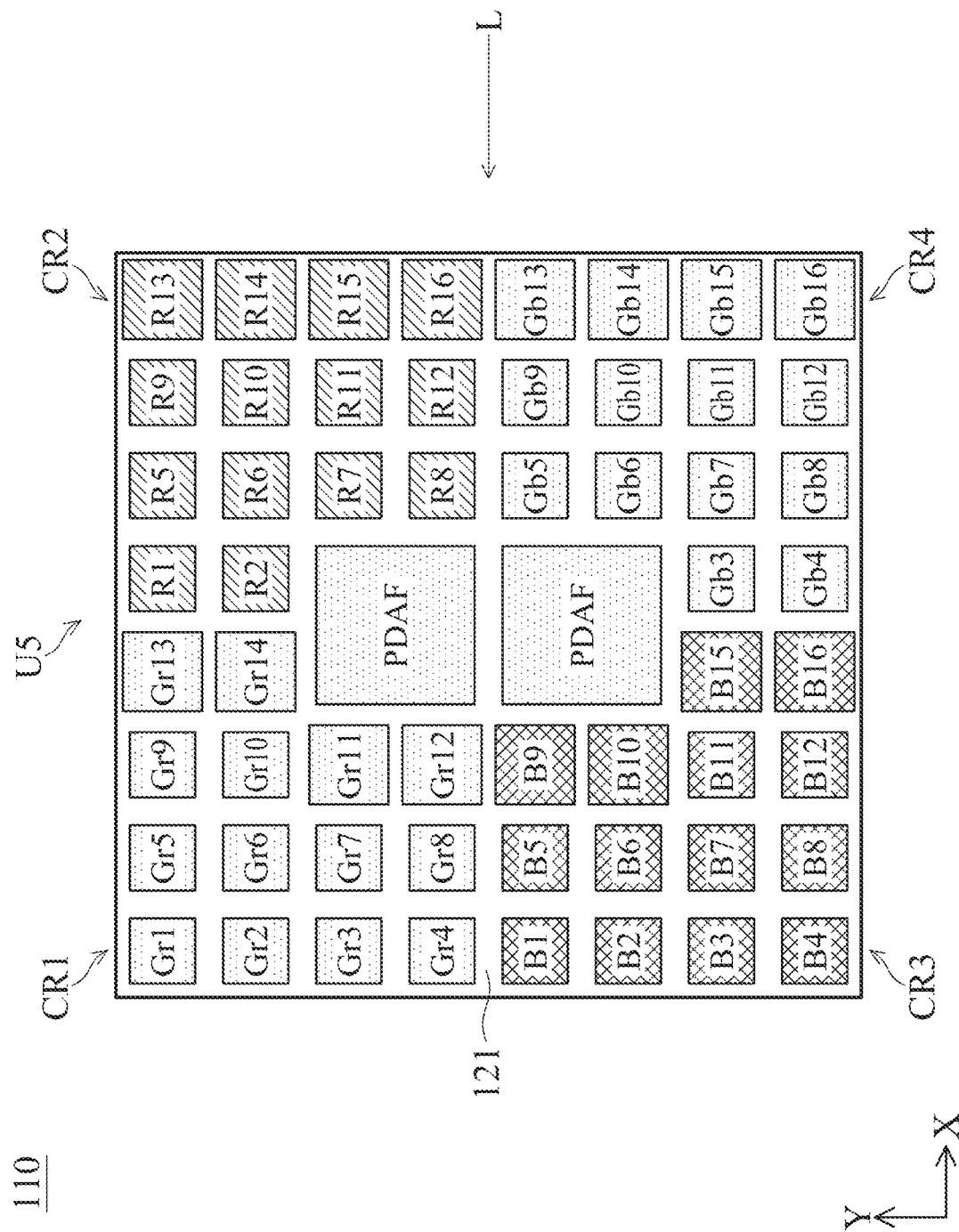
FIG. 11 is a partial top view illustrating the solid-state image sensor in accordance with some embodiments of the present disclosure.

FIG. 11 is a partial top view illustrating the solid-state image sensor 110 in accordance with some embodiments of the present disclosure. As shown in FIG. 11, in some embodiments, four color regions CR1, CR2, CR3, and CR4 of the solid-state image sensor 110 form a unit pattern U5. For example, each of the color regions CR1, CR2, CR3, and CR4 corresponds to a 4×4 pixel array. In some embodiments, the auto-focus pixels form two or more auto-focus pixel arrays PDAF. That is, there is more than one auto-focus pixel array PDAF in the unit pattern U5. For example, two auto-focus pixel arrays PDAF are in the unit pattern U5. In more detail, two auto-focus pixel arrays PDAF are disposed in and correspond to all color regions (i.e., the color regions CR1, CR2, CR3, and CR4). Moreover, each auto-focus pixel array PDAF is a 2×2 pixel array.

As shown in FIG. 11, the incident light L is from the right side of the unit pattern U5 of the solid-state image sensor 110. In the color region CR1, the color filter layer (the (green) color filter segment) that corresponds to the normal pixel Gr11, Gr12, Gr13, or Gr14 is disposed on the side that is closer to the incident light L, so that the width of the (green) color filter segment that corresponds to the normal pixel Gr11, Gr12, Gr13, or Gr14 is greater than the width of the (green) color filter segment that corresponds to the normal pixel Gr1, Gr2, Gr3, Gr4, Gr5, Gr6, Gr7, Gr8, Gr9, or Gr10. In the color region CR2, the color filter layer (the (red) color filter segment) that corresponds to the normal pixel R13, R14, R15, or R16 is disposed on the side that is closer to the incident light L, so that the width of the (red) color filter segment that corresponds to the normal pixel R13, R14, R15, or R16 is greater than the width of the (red) color filter segment that corresponds to the normal pixel R1, R2, R5, R6, R7, R8, R9, R10, R11 or R12. In the color region CR3, the color filter layer (the (blue) color filter segment) that corresponds to the normal pixel B9, B10, B15 or B16 is disposed on the side that is closer to the incident light L, so that the width of the (blue) color filter segment that corresponds to the normal pixel B9, B10, B15 or B16 is greater than the width of the (blue) color filter segment that corresponds to the normal pixel B1, B2, B3, B4, B5, B6, B7, B8, B11, or B12. In the color region CR4, the color filter layer (the (green) color filter segment) that corresponds to the normal pixel Gb13, Gb14, Gb15, or Gb16 is disposed on the side that is closer to the incident light L, so that the width of the (green) color filter segment that corresponds to the normal pixel Gb13, Gb14, Gb15, or Gb16 is greater than the width of the (green) color filter segment that corresponds to the normal pixel Gb3, Gb4, Gb5, Gb6, Gb7, Gb8, Gb9, Gb10, Gb11, or Gb12.

Figure 12:
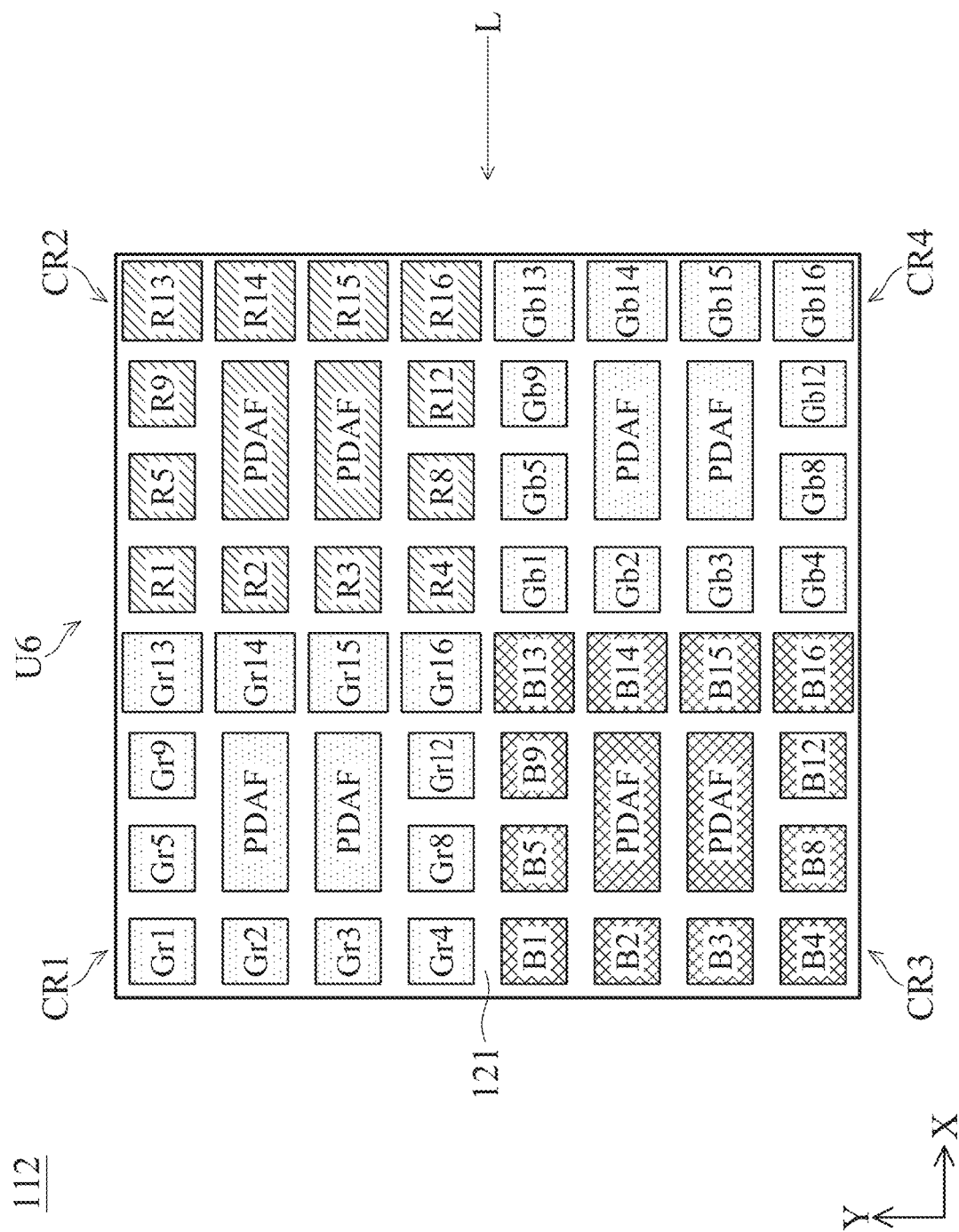
FIG. 12 is a partial top view illustrating the solid-state image sensor in accordance with some embodiments of the present disclosure.

FIG. 12 is a partial top view illustrating the solid-state image sensor 112 in accordance with some embodiments of the present disclosure. As shown in FIG. 12, in some embodiments, four color regions CR1, CR2, CR3, and CR4 of the solid-state image sensor 112 form a unit pattern U6. For example, each of the color regions CR1, CR2, CR3, and CR4 corresponds to a 4×4 pixel array. In some embodiments, the auto-focus pixels form two or more auto-focus pixel arrays PDAF. That is, there is more than one auto-focus pixel array PDAF in the unit pattern U6. For example, eight auto-focus pixel arrays PDAF are in the unit pattern U6. In more detail, eight auto-focus pixel arrays PDAF are disposed in and correspond to all color regions (i.e., the color regions CR1, CR2, CR3, and CR4). Moreover, each auto-focus pixel array PDAF is a 2×1 pixel array.

As shown in FIG. 12, the incident light L is from the right side of the unit pattern U6 of the solid-state image sensor 112. In the color region CR1, the color filter layer (the (green) color filter segment) that corresponds to the normal pixel Gr13, Gr14, Gr15, or Gr16 is disposed on the side that is closer to the incident light L, so that the width of the (green) color filter segment that corresponds to the normal pixel Gr13, Gr14, Gr15, or Gr16 is greater than the width of the (green) color filter segment that corresponds to the normal pixel Gr1, Gr2, Gr3, Gr4, Gr5, Gr8, Gr9, or Gr12. In the color region CR2, the color filter layer (the (red) color filter segment) that corresponds to the normal pixel R13, R14, R15, or R16 is disposed on the side that is closer to the incident light L, so that the width of the (red) color filter segment that corresponds to the normal pixel R13, R14, R15, or R16 is greater than the width of the (red) color filter segment that corresponds to the normal pixel R1, R2, R3, R4, R5, R8, R9, or R12. In the color region CR3, the color filter layer (the (blue) color filter segment) that corresponds to the normal pixel B13, B14, B15 or B16 is disposed on the side that is closer to the incident light L, so that the width of the (blue) color filter segment that corresponds to the normal pixel B13, B14, B15 or B16 is greater than the width of the (blue) color filter segment that corresponds to the normal pixel B1, B2, B3, B4, B5, B8, B9, or B12. In the color region CR4, the color filter layer (the (green) color filter segment) that corresponds to the normal pixel Gb13, Gb14, Gb15, or Gb16 is disposed on the side that is closer to the incident light L, so that the width of the (green) color filter segment that corresponds to the normal pixel Gb13, Gb14, Gb15, or Gb16 is greater than the width of the (green) color filter segment that corresponds to the normal pixel Gb1, Gb2, Gb3, Gb4, Gb5, Gb8, Gb9, or Gb12.

In summary, according to the embodiments of the present disclosure, the solid-state image sensor includes color filter segments having variable widths, which may improve channel separation, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
   photoelectric conversion elements; and
   a color filter layer disposed above the photoelectric conversion elements;
   wherein the photoelectric conversion elements and the color filter layer form normal pixels and auto-focus pixels, the color filter layer that correspond to the normal pixels are divided into first color filter segments and second color filter segments, the first color filter segments are disposed on at least one side that is closer to an incident light, and a width of the first color filter segments is greater than a width of the second color filter segments.

2. The solid-state image sensor as claimed in claim 1, wherein at least one of the first color filter segments that is adjacent to the auto-focus pixels has a greater width than other of the first color filter segments.

3. The solid-state image sensor as claimed in claim 1, wherein the color filter layer has four color regions corresponding to at least two different colors, and at least one of the auto-focus pixels is disposed in and corresponds to one of the four color regions.

4. The solid-state image sensor as claimed in claim 3, wherein the width of the first color filter segments in one of the four color regions is different from the width of the first color filter segments in another of the four color regions.

5. The solid-state image sensor as claimed in claim 3, wherein each of the four color regions corresponds to an n2 pixel array, and n is an integer greater than or equal to 3.

6. The solid-state image sensor as claimed in claim 5, wherein the auto-focus pixels form an auto-focus pixel array, and the auto-focus pixel array is a p×q pixel array, where p and q are integers less than n.

7. The solid-state image sensor as claimed in claim 3, wherein the four color regions form a unit pattern, and more than one unit pattern forms an array.

8. The solid-state image sensor as claimed in claim 3, wherein the auto-focus pixels are disposed in and correspond to all of the four color regions.

9. The solid-state image sensor as claimed in claim 3, wherein the auto-focus pixels are disposed in and correspond to at least two of the four color regions.

10. The solid-state image sensor as claimed in claim 1, wherein the normal pixels have a constant pixel width that is equal to or less than 0.7 μm.

11. The solid-state image sensor as claimed in claim 1, further comprising:
    a grid structure disposed between the first color filter segments and between the second color filter segments, wherein the grid structure has grid segments, and each of the grid segments has a variable width.

12. The solid-state image sensor as claimed in claim 11, further comprising:
    a metal grid disposed on a bottom of the grid structure, wherein the metal grid has metal segments, and the metal segments have a constant width.

13. The solid-state image sensor as claimed in claim 11, further comprising:
    a metal grid disposed on a bottom of the grid structure, wherein the metal grid has metal segments, and each of the metal segments has a variable width with respect to a corresponding one of the grid segments.

14. The solid-state image sensor as claimed in claim 1, further comprising:
    condensing structures disposed on and corresponding to the first color filter segments and the second color filter segments.

15. The solid-state image sensor as claimed in claim 14, wherein each of the condensing structures has a variable width with respect to a corresponding one of the first color filter segments and the second color filter segments.

16. The solid-state image sensor as claimed in claim 1, wherein at least one of the first color filter segments and the second color filter segments has a shift with respect to a corresponding one of the photoelectric conversion elements.

17. The solid-state image sensor as claimed in claim 1, wherein the auto-focus pixels form two or more auto-focus pixel arrays.

18. The solid-state image sensor as claimed in claim 17, wherein the auto-focus pixel arrays are disposed in and correspond to at least two of the four color regions.

19. The solid-state image sensor as claimed in claim 17, wherein the auto-focus pixel arrays are disposed in and correspond to all of the four color regions.

20. The solid-state image sensor as claimed in claim 1, wherein the normal pixels comprise red color filters, green color filters, blue color filters, yellow color filters, white color filters, cyan color filters, magenta color filters, or IR/NIR color filters.

* * * * *